United States Patent
Fujiwara et al.

(10) Patent No.: US 11,657,870 B2
(45) Date of Patent: *May 23, 2023

(54) METHOD AND SYSTEM TO BALANCE GROUND BOUNCE

(71) Applicant: Taiwan Semiconductor Manufacturing Company, Ltd., Hsinchu (TW)

(72) Inventors: Hidehiro Fujiwara, Hsin-chu (TW); Hsien-Yu Pan, Hsinchu (TW); Chih-Yu Lin, Taichung (TW); Yen-Huei Chen, Jhudong Township (TW); Wei-Chang Zhao, Hsinchu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 17/381,234

(22) Filed: Jul. 21, 2021

(65) Prior Publication Data

US 2021/0350849 A1    Nov. 11, 2021

Related U.S. Application Data

(63) Continuation of application No. 16/659,055, filed on Oct. 21, 2019, now Pat. No. 11,074,966.

(Continued)

(51) Int. Cl.
*G11C 16/04* (2006.01)
*G11C 11/419* (2006.01)
(Continued)

(52) U.S. Cl.
CPC .......... *G11C 11/419* (2013.01); *G11C 11/412* (2013.01); *H01L 27/0207* (2013.01); *H01L 27/1104* (2013.01)

(58) Field of Classification Search
CPC .......................... G11C 11/419; G11C 11/412
See application file for complete search history.

(56) References Cited

U.S. PATENT DOCUMENTS 8,929,130 B1 * 1/2015 Liaw ..................... G11C 11/419
                                                                365/156
9,093,125 B2   7/2015 Puckett et al.
(Continued)

FOREIGN PATENT DOCUMENTS

CN    103377685 A    10/2013
CN    107424645 A    12/2017
(Continued)

*Primary Examiner* — Pho M Luu
(74) *Attorney, Agent, or Firm* — Merchant & Gould P.C.

(57) ABSTRACT

A memory cell includes a write port and a read port. The write port includes two cross-coupled inverters that form a storage unit. The cross-coupled inverters are connected between a first power source signal line and a second power source signal line. The write port also includes a first local interconnect line in an interconnect layer that is connected to the second power source signal line. The read port includes a transistor that is connected to the storage unit in the write port and to the second power source signal line, and a second local interconnect line in the interconnect layer that is connected to the second power source signal line. The second local interconnect line in the read port is separate from the first local interconnect line in the write port.

20 Claims, 7 Drawing Sheets

Related U.S. Application Data

(60) Provisional application No. 62/753,749, filed on Oct. 31, 2018.

(51) Int. Cl.
   *H01L 27/02* (2006.01)
   *H01L 27/11* (2006.01)
   *G11C 11/412* (2006.01)

(56) References Cited

U.S. PATENT DOCUMENTS

| | | |
|---|---|---|
| 9,257,172 B2 | 2/2016 | Fujiwara et al. |
| 9,892,781 B2 | 2/2018 | Liaw |
| 10,153,035 B2 | 12/2018 | Lin et al. |
| 11,074,966 B2 * | 7/2021 | Fujiwara ............... G11C 11/419 |
| 2003/0185044 A1 | 10/2003 | Nii |
| 2008/0137440 A1 | 6/2008 | Liaw |
| 2015/0162074 A1 | 6/2015 | Lin et al. |
| 2015/0248927 A1 | 9/2015 | Fujiwara et al. |
| 2016/0225413 A1 | 8/2016 | Liaw |
| 2017/0098471 A1 * | 4/2017 | Phillips .................... G11C 8/16 |

FOREIGN PATENT DOCUMENTS

| | | |
|---|---|---|
| KR | 10-2003-0079670 A | 10/2003 |
| KR | 10-2016-0096001 A | 8/2016 |
| KR | 10-2017-0000374 A | 1/2017 |
| TW | 200305275 A | 10/2003 |
| TW | 201346907 A | 11/2013 |
| TW | 201814696 A | 4/2018 |

* cited by examiner

METHOD AND SYSTEM TO BALANCE GROUND BOUNCE

CROSS-REFERENCE TO RELATED APPLICATION(S)

This application is a continuation of U.S. patent application Ser. No. 16/659,055, filed Oct. 21, 2019, now U.S. Pat. No. 11,074,966, which application claims priority to U.S. Provisional Application No. 62/753,749, filed on Oct. 31, 2018, the entire disclosures of which are hereby incorporated by reference in their entirety.

BACKGROUND

Different types of memory devices are used in electronic devices for various purposes. Read only memory (ROM) and random access memory (RAM) are two such types of memory devices. A ROM device permits data to be read from, but not written to, the ROM device. The ROM device retains its stored data when power is switched off. As such, a ROM device is typically used to store programs that are executed when the electronic device is turned on.

Unlike ROM devices, a RAM device allows data to be written to, and read from, selected memory cells in the RAM device. One type of a RAM device is a static random access memory (SRAM) device. SRAM devices have the advantageous feature of holding data without requiring a refresh. A single port memory cell in an SRAM device includes one set of addressing signal lines that enable the memory cell to either perform a write operation or a read operation.

Another type of SRAM memory cell is referred to as dual port SRAM cell, which includes two sets of addressing signal lines that that enable the memory cell to perform a write operation and a read operation. One type of a dual port SRAM memory cell is an eight transistor (8T) SRAM memory cell that includes a write port that performs only write operations and a separate read port that performs only read operations. In some situations, the ground bounce in the two port memory cell is not balanced due at least in part to a difference in the amount of current produced during certain read operations. For example, the amount of current produced in the write port when reading a logical "0" from the memory cell can be greater than the amount of current produced when reading a logical "1" from the memory cell. The different currents result in an unbalanced ground bounce in the write port.

BRIEF DESCRIPTION OF THE DRAWINGS

The disclosure will be readily understood by the following detailed description in conjunction with the accompanying drawings, wherein like reference numerals designate like structural elements, and in which.

DETAILED DESCRIPTION

Figure 1:
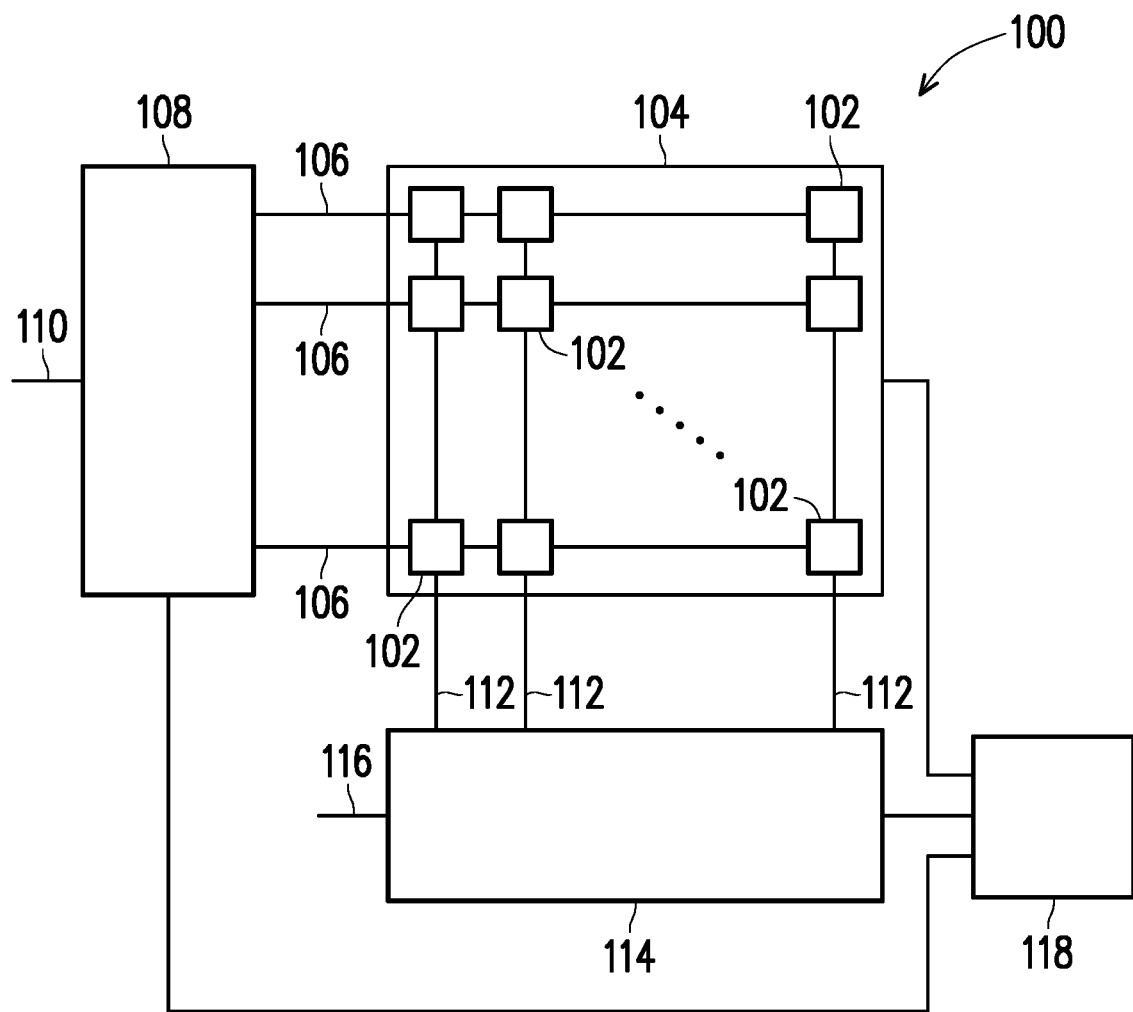
FIG. 1 illustrates a block diagram of a memory device in which aspects of the disclosure may be practiced in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

As used herein, the terms "coupled", "connected", and "operably connected" are intended to be interpreted broadly as referring to a direct connection between a first feature and a second feature, and an indirect connection where an additional feature or features are connected between the first and second features.

Embodiments described herein provide a memory cell that includes write port and a read port, where the ground bounce is substantially balanced in the write port. The write port includes two cross-coupled inverters that form a storage unit. The cross-coupled inverters are connected between a first power source signal line and a second power source signal line. The write port also includes a first local interconnect line in an interconnect layer that is connected to the first power source signal line and a second local interconnect line in the interconnect layer that is connected to the second power source signal line. The read port includes a transistor that is connected to the storage unit in the write port and to the second power source signal line. A third local interconnect line in the read port that is in the same interconnect layer as the first and the second local interconnect lines is also connected to the second power source signal line. The third local interconnect line in the read port is separate from, and not part of, the second local interconnect line in the write port. Because the third local interconnect line is separate from the second local interconnect line, the current produced in the write port is not substantially impacted by the current produced in the read port during read operations, which causes the ground bounce effect in the write port to be substantially balanced.

These and other embodiments are discussed below with reference to FIGS. 1-7. However, those skilled in the art will readily appreciate that the detailed description given herein with respect to these Figures is for explanatory purposes only and should not be construed as limiting.

FIG. 1 illustrates a block diagram of a memory device in which aspects of the disclosure may be practiced in accordance with some embodiments. In the illustrated embodiment, the memory device 100 includes memory cells 102 that are arranged in rows and columns to form a memory array 104. The memory device 100 can include any suitable number of rows and columns. For example, a memory device includes R number of rows and C number of columns, where R is an integer greater than or equal or one and C is a number greater than or equal to two. The memory device 100 can be any suitable type of a memory device, including, but not limited to, a static random access memory device.

Each row of memory cells 102 is operably connected to one or more word line signal lines (collectively word line signal line 106). The word line signal lines 106 are operably connected to one or more row select circuits (collectively referred to as row select circuit 108). The row select circuit 108 selects a particular word line signal line 106 based on an address signal that is received on signal line 110.

Each column of memory cells 102 is operably connected to one or more bit line signal lines (collectively bit line signal line 112). The bit line signal lines 112 are operably connected to a one or more column select circuits (collectively referred to as column select circuit 114). The column select circuit 114 selects a particular bit line signal line 112 based on a select signal that is received on signal line 116.

A processing device 118 is operably connected to the memory array 104, the row select circuit 108, and the column select circuit 114. The processing device 118 is operable to control one or more operations of the memory device 100. For example, the processing device 118 can control one or more operations of the memory array 104, the row select circuit 108, and the column select circuit 114. The processing device 118 can be disposed in the same circuitry (e.g., the same integrated circuit) as the memory device 100, or the processing device 118 may be disposed in circuitry that is separate from the memory device 100 and operably connected to the memory device 100. Any suitable processing device can be used. Example processing devices include, but are not limited to, a central processing unit, a microprocessor, an application specific integrated circuit, a graphics processing unit, a field programmable gate array, or combinations thereof.

When data is to be written to a memory cell 102 (e.g., the memory cell 102 is programmed), or when data is to be read from a memory cell 102, the processing device 118 causes an address for the memory cell 102 to be input on signal line 110. The row select circuit 108 activates or asserts the word line signal line 106 associated with the address. A select signal is received on the signal line 116 and the bit line signal line 112 associated with the select signal is asserted or activated. The data is then written to, or read from, the memory cell 102.

Figure 2:
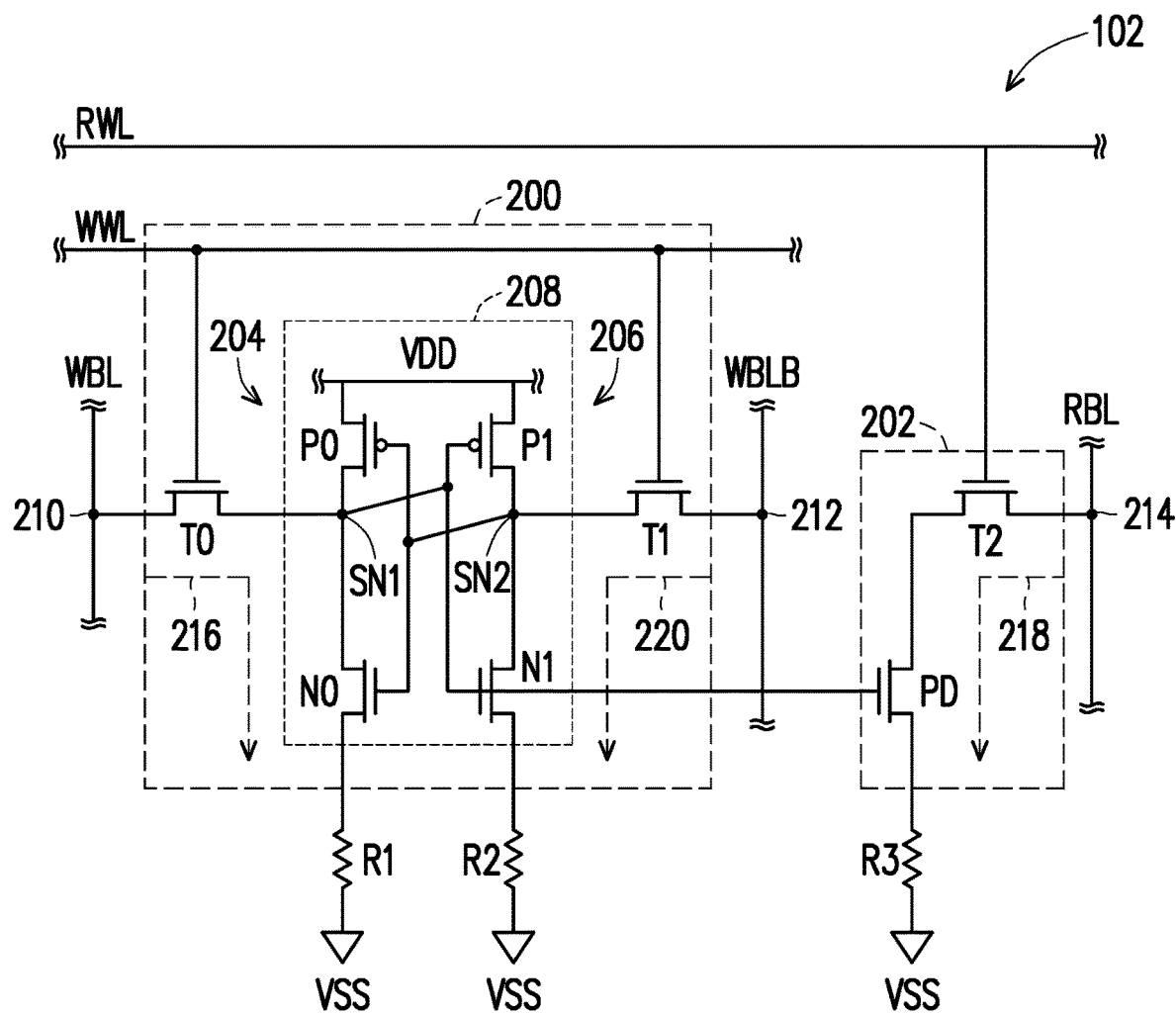
FIG. 2 depicts a schematic diagram of a first memory cell in accordance with some embodiments.

FIG. 2 depicts a schematic diagram of a first memory cell in accordance with some embodiments. The example memory cell 102 includes a write port 200 and a read port 202. The memory cell 102 is referred to as a dual port memory cell. The write port 200 includes a first cross-coupled inverter 204 operably connected to a second cross-coupled inverter 206. In the illustrated embodiment, each cross-coupled inverter 204, 206 includes a p-type transistor P0, P1 (e.g., a p-type metal oxide semiconductor (PMOS) transistor) operably connected in series to a respective n-type transistor N0, N1 (e.g., n-type metal oxide semiconductor (NMOS) transistor). In the first cross-coupled inverter 204, a first terminal of the p-type transistor P0 is operably connected to a first power source signal line (e.g., supply voltage (VDD) signal line) and a second terminal of the p-type transistor P0 is operably connected to a node SN1. A first terminal of the n-type transistor N0 is operably connected to the node SN1 and the second terminal of the n-type transistor N0 is operably connected to a second power source signal line (e.g., a reference voltage (VSS) signal line). A gate of the p-type transistor P0 and a gate of the n-type transistor N0 are operably connected to each other and to a node SN2 in the second cross-coupled inverter 206.

Similarly, in the second cross-coupled inverter 206, a first terminal of the p-type transistor P1 is operably connected to the first power source signal line (e.g., supply voltage (VDD) signal line) and a second terminal of the p-type transistor P1 is operably connected to the node SN2. The first terminal of the n-type transistor N1 is operably connected to the node SN2 and the second terminal of the n-type transistor N1 is operably connected to the second power source signal line (e.g., reference voltage (VSS) signal line). The gate of the p-type transistor P1 and the gate of the n-type transistor N1 are operably connected to each other and to the node SN1 in the first cross-coupled inverter 204. The cross-coupled inverters 204, 206 form a storage unit 208 having two stable states that are used to denote a logical "0" and a logical "1". When the storage node SN1 is a logical "1", usually a high voltage, the storage node SN2 is at the same time a logical "0", usually a low voltage, and vice versa.

The first cross-coupled inverter 204 is connected to a first pass transistor T0 and the second cross-coupled inverter 206 is connected to a second pass transistor T1. The first and the second pass transistors T0, T1 control access to the storage unit 208 during write operations and enable data (bits) to be written to the memory cell 102. In the illustrated embodiment, the pass transistors T0, T1 are n-type transistors (e.g., NMOS transistors). In the memory cell 102, the gate of the first pass transistor T0 and the gate of the second pass transistor T1 are operably connected to a write word line (WWL) signal line. The WWL signal line is asserted (e.g., turned on) only for write operations to the memory cell 102. A first terminal of the first pass transistor T0 is operably connected to a write bit line (WBL) signal line at node 210 and the second terminal of the first pass transistor T0 is operably connected to the node SN1 in the first cross-coupled inverter 204. With respect to the second pass transistor T1, a first terminal of the second pass transistor T1 is operably connected to a write bit line bar (WBLB) signal line at node 212 and the second terminal of the second pass transistor T1 is operably connected to the node SN2 in the second cross-coupled inverter 206.

The read port 202 includes a pass transistor (T2) and a pull down transistor (PD) connected in series. In the illustrated embodiment, the pull down transistor (PD) and the pass transistor (T2) are both n-type transistors (e.g., NMOS transistors). The gate of the pass transistor (T2) is operably connected to a read word line (RWL) signal line. The RWL signal line is asserted (e.g., turned on) only for read operations to the memory cell 102. A first terminal of the pass transistor (T2) is operably connected to a read bit line (RBL) signal line at node 214 and the second terminal of the pass transistor (T2) is operably connected to a first terminal of the pull down transistor (PD). The second terminal of the pull down transistor (PD) is operably connected to the second power source signal line (e.g., the reference voltage (VSS) signal line).

When the memory cell 102 is written to, complementary write data signals are placed on the WBL and the WBLB signal lines. The WWL signal line is asserted to turn on both pass transistors T0, T1. The data on the WBL signal line and the data on the WBLB signal line may overwrite stored data to write to, or program, the memory cell 102. When the memory cell 102 is read from, the RWL is asserted to turn on the pass transistor T2, which allows the RBL signal line to be coupled to, and receive data from, the storage node SN1 or SN2.

The resistors R1, R2, and R3 represent the resistance of the conductive signal lines between the second terminals of the n-type transistors N0, N1, and PD and the second power source signal line (e.g., reference voltage (VSS) signal line). When the memory cell 102 stores a logical 1 at SN1, and a read operation is performed, current 216 flows from SN1 through R1 and current 218 flows from the pull down transistor (PD) through R3. Thus, the current 216 flows on the left side of the storage unit 208. When the memory cell 102 stores a logical 0 at SN2, and a read operation is performed, current 220 flows from SN2 through R2 and current 218 flows through the pull down transistor (PD) through R3. Thus, the current 220 flows on the right side of the storage unit 208. As will be described in more detail in conjunction with FIGS. 3 and 4, the ground bounce in the illustrated write port 200 is substantially balanced due to the local interconnect line in the write port 200 that is operably connected to the second power source signal line (e.g., the reference voltage (VSS) signal line) being separate and distinct from the local interconnect line in the read port 202 that is operably connected to the second power source signal line. The current 220 is not substantially impacted by the current 218, which allows the ground bounce effect in the write port 200 to be substantially balanced.

Figure 3:
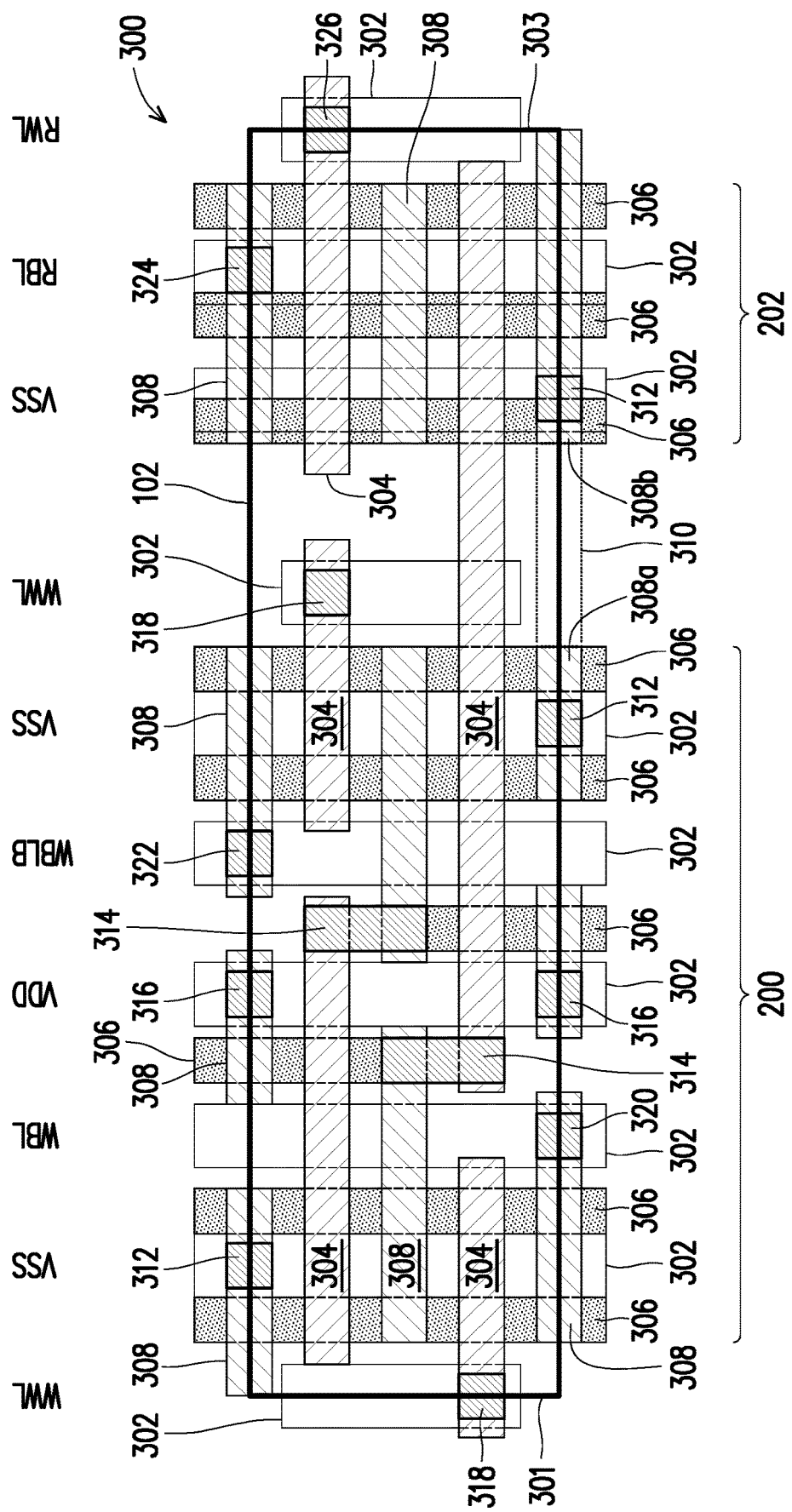
FIG. 3 illustrates a first layout of the first memory cell shown in FIG. 2.

FIG. 3 illustrates a first layout of the first memory cell shown in FIG. 2. The layout 300 depicts the write port 200 and the read port 202 of the memory cell 102. In the write port 200, the WWL signal line, the second power source signal line (e.g., the reference voltage (VSS) signal line), the WBL signal line, the first power source signal line (e.g., the supply voltage (VDD) signal line), and the WBLB signal line are formed in a first conductive layer 302. In a non-limiting example, the first conductive layer 302 is a first metal layer (M1) in the memory device, although other embodiments are not limited to this configuration. In the illustrated embodiment, the signal line order (from left or first edge 301 of the memory cell 102 to right or interior of the memory cell 102) of the first conductive layer 302 in the write port 200 in the memory cell 102 is as follows: WWL signal line-second power source signal line (VSS signal line)-WBL signal line-first power source signal line (VDD signal line)-WBLB signal line-second power source signal line (VSS signal line)-WWL signal line.

In the read port 202, the RWL signal line, the second power source signal line (e.g., the reference voltage (VSS) signal line), and the RBL signal line are formed in the same first conductive layer 302 of the memory device. In FIG. 3, the RBL signal line in the read port 202 is positioned between the signal line for the second power source signal line (VSS signal line) and the RWL signal line. The signal line order (from left or interior of the memory cell 102 to right or opposite second edge 303 of the memory cell 102) of the conductive layer 302 in the read port 202 in the memory cell 102 is as follows: second power source signal line (VSS signal line)-RBL signal line-RWL signal line. Thus, for the entire memory cell 102, the signal line order of the conductive layer 302 (from first edge 301 to the opposite second edge 303 of the memory cell 102) is as follows: WWL signal line-second power source signal line (VSS signal line)-WBL signal line-first power source signal line (VDD signal line)-WBLB signal line-second power source signal line (VSS signal line)-WWL signal line-second power source signal line (VSS signal line)-RBL signal line-RWL signal line.

Signal lines in a second conductive layer 304 are disposed perpendicular to the signal lines in the first conductive layer 302. In a non-limiting example, the second conductive layer 304 is a polysilicon layer. The layout 300 further shows the fin active regions 306 of FinFET transistors in the memory cell 102.

Local interconnect lines 308 are also disposed perpendicular to the signal lines in the first conductive layer 302. In a non-limiting example, the local interconnect lines 308 are formed in a first local interconnect layer (L1) in the memory device, although other embodiments are not limited to this implementation. In the illustrated embodiment, the local interconnect lines 308 in the write port 200 are separate and distinct from the local interconnect lines 308 in the read port 202. As discussed earlier, this separateness causes the ground bounce in the write port 200 to be substantially balanced. In particular, the ground bounce in the left-side of the storage unit (e.g., the first cross-coupled inverter 204) and the ground bounce in the right-side of the storage unit (e.g., cross-coupled inverter 206) in the write port 200 are substantially balanced due to the local interconnect line 308a in the write port 200 being separate from the local interconnect line 308b in the read port 202. The local interconnect line 308a does not extend from the write port 200 to the read port 202 (e.g., the local interconnect line 308a/308b is absent in the area highlighted by the dashed rectangle 310).

Various contacts between signal lines are also illustrated in the layout 300. Contacts 312 are formed in the write port 200 and in the read port 202 between respective local interconnect lines 308 and the second power source signal line (e.g., VSS signal line). Contacts 314 are formed in the write port 200 between respective signal lines in the second conductive layer 304 and a respective local interconnect layer 308. Contacts 316 are formed in the write port 200 between respective local interconnect lines 308 and the first power source signal line (VDD signal line). Contacts 318 are formed in the write port 200 between respective signal lines in the second conductive layer 304 and the WWL signal lines. A contact 320 is formed in the write port 200 between the WBL signal line and a respective local interconnect line 308. A contact 322 is formed in the write port 200 between the WBLB signal line and a respective local interconnect line 308. A contact 324 is formed in the read port 202 between the RBL signal line and a respective local interconnect line 308. A contact 326 is formed in the read port 202 between the RWL signal line and a respective signal line in the second conductive layer 304.

Figure 4:
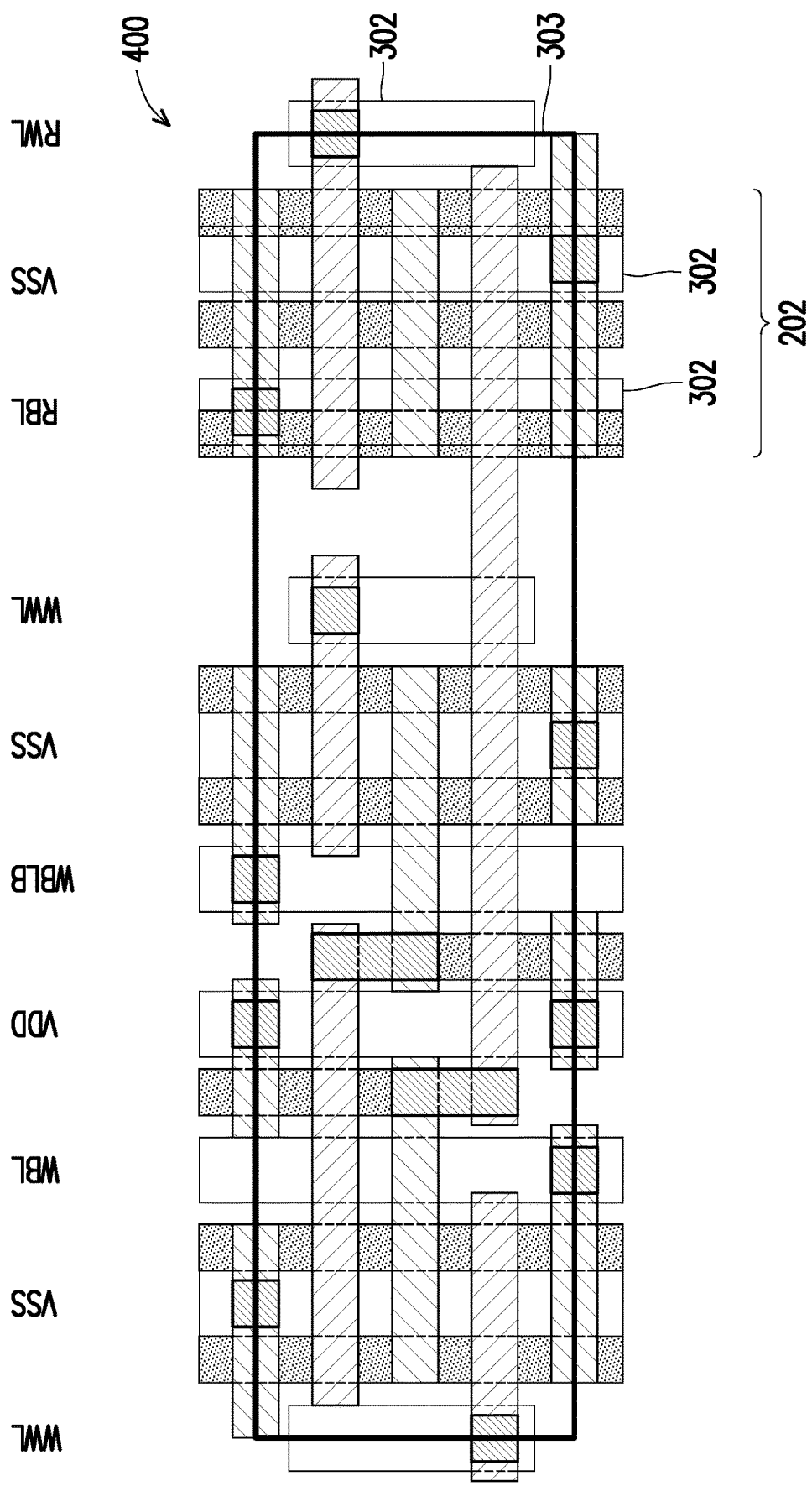
FIG. 4 depicts a second layout of the first memory cell shown in FIG. 2.

FIG. 4 depicts a second layout of the first memory cell shown in FIG. 2. The layout 400 is the same layout as the layout 300 shown in FIG. 3 except for the switch of the RBL signal line with the second power source signal line (e.g., reference voltage (VSS) signal line) in the read port 202. Thus, the signal line for the second power source signal line (VSS signal line) is located between the RBL signal line and the RWL signal line. In this embodiment, the signal line order (from left or interior of the memory cell 102 to right or opposite second edge 303 of the memory cell 102) in the first conductive layer 302 of the read port 202 in the memory cell 102 is as follows: RBL signal line-second power source signal line (VSS signal line)-RWL signal line. In some embodiments, positioning the second power source signal line (e.g., reference voltage (VSS) signal line) between the RBL signal line and the RWL signal line can enable the parasitic capacitance of the RBL signal line to be reduced compared to the parasitic capacitance of the RBL signal line in FIG. 3. This reduction in parasitic capacitance results from the distance between the RBL signal line in the read port 202 and the WWL signal line in the write port 200 (FIG. 4) being greater than the distance between the RBL signal and the second power source signal line (VSS signal line) in the read port 202 (FIG. 3). Since dynamic power is proportional to $CV^2$, the lower parasitic capacitance of the RBL signal line produces smaller dynamic power and faster speed.

Figure 5:
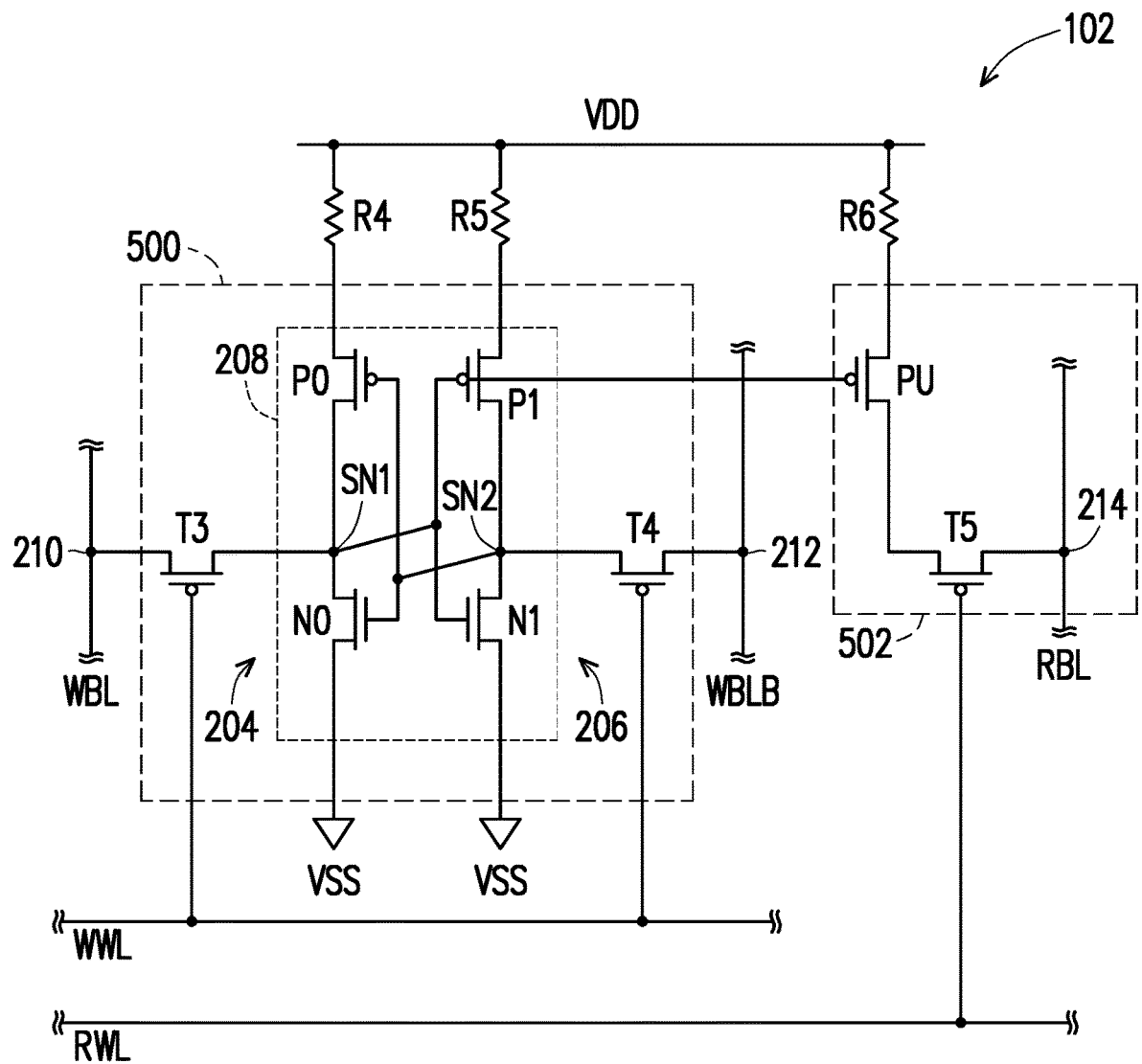
FIG. 5 illustrates a schematic diagram of a second memory cell in accordance with some embodiments.

FIG. 5 illustrates a schematic diagram of a second memory cell in accordance with some embodiments. The memory cell 102 includes a write port 500 and a read port 502. The construction of the illustrated memory cell 102 is similar to the construction of the memory cell 102 shown in FIG. 2 except that the read port 502 includes a pull up transistor (PU) and the FIG. 5 memory cell 102 has a polarity that is opposite from the polarity of the memory cell 102 shown in FIG. 2. In particular, the pass transistors T3, T4 in the write port 500 and the pass transistor T5 and the pull up transistor (PU) in the read port 502 are p-type transistors (e.g., PMOS transistors). The resistors R4, R5, and R6 represent the resistance of the conductive signal lines between the first terminals of the transistors P0, P1, and PU and the first power source signal line (e.g., supply voltage (VDD) signal line).

The storage unit 208 in the write port 500 is constructed similarly to the storage unit 208 shown in FIG. 2. The first cross-coupled inverter 204 is connected to the first pass transistor T3 and the second cross-coupled inverter 206 is connected to the second pass transistor T4. The gate of the first pass transistor T3 and the gate of the second pass transistor T4 are operably connected to the WWL signal line. A first terminal of the first pass transistor T3 is operably connected to a WBL signal line at node 210 and the second terminal of the first pass transistor T3 is operably connected to the storage node SN1 in the first cross-coupled inverter 204. With respect to the second pass transistor T4, a first terminal of the second pass transistor T4 is operably connected to the WBLB signal line at node 212 and the second terminal of the second pass transistor T4 is operably connected to the node SN2 in the second cross-coupled inverter 206.

The read port 502 includes the pass transistor T5 and the pull up transistor (PU) connected in series. The gate of the pass transistor T5 is operably connected to the RWL signal line. The first terminal of the pass transistor T5 is operably connected to the RBL signal line at node 214 and the second terminal of the pass transistor T5 is operably connected to a first terminal of the pull up transistor (PU). The second terminal of the pull up transistor (PU) is operably connected to the first power source signal line (e.g., the supply voltage (VDD) signal line).

Figure 6:
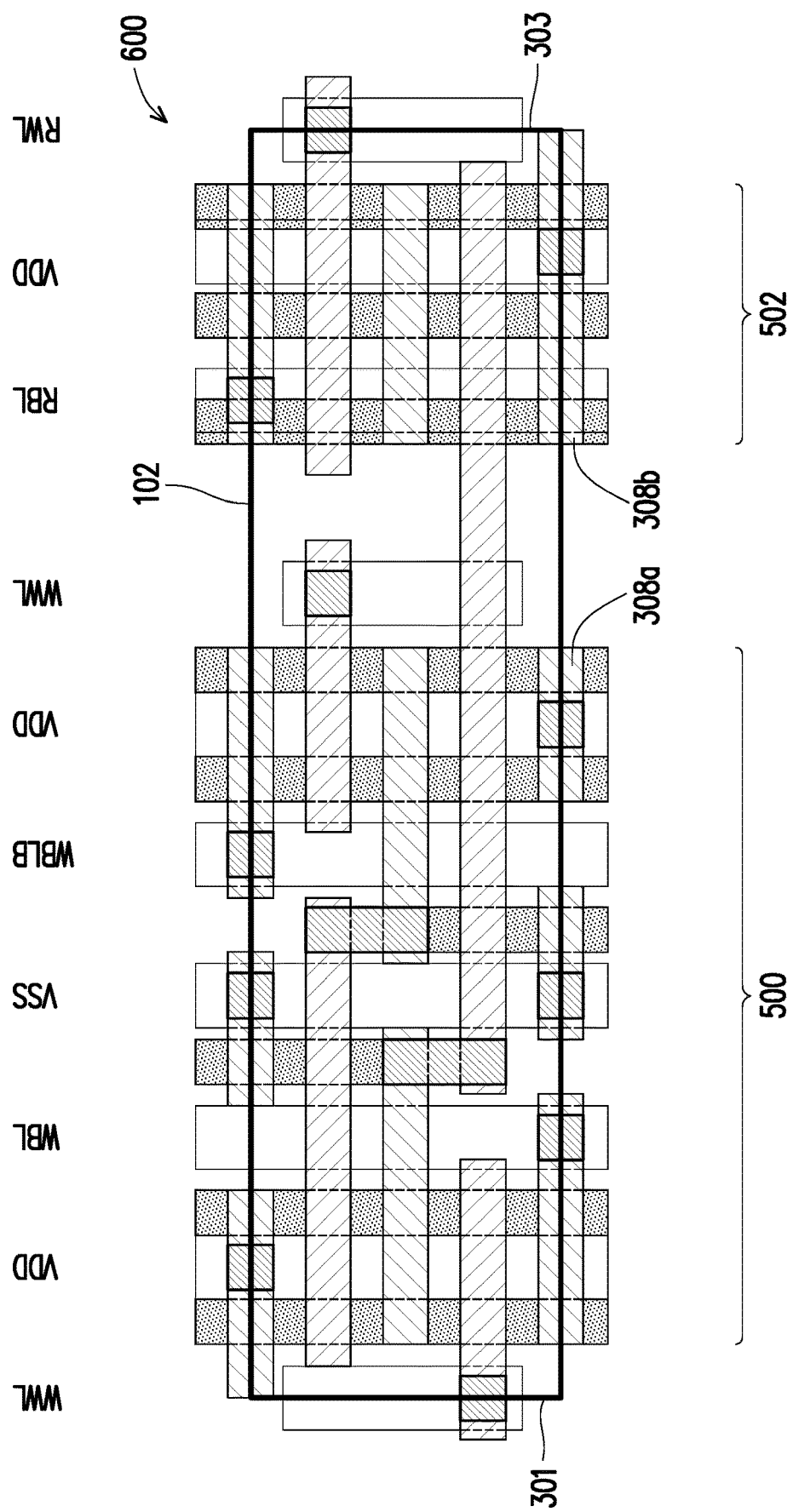
FIG. 6 depicts a layout of the second memory cell shown in FIG. 5.

FIG. 6 depicts a layout of the second memory cell shown in FIG. 5. The layout 600 is similar to the layout 400 shown in FIG. 4 except for the reversal of the second power source signal lines (e.g., reference voltage (VSS) signal lines) and the first power source signal lines (e.g., supply voltage (VDD) signal lines) in both the write port 500 and the read port 502. In the illustrated embodiment, the signal line order (from the first edge 301 to the opposite second edge 303 of the memory cell 102) of the conductive layer (e.g., the first conductive layer 302) in the memory cell 102 is as follows: WWL signal line-first power source signal line (VDD signal line)-WBL signal line-second power source signal line (VSS signal line)-WBLB signal line-first power source signal line (VDD signal line)-WWL signal line-RBL signal line-first power source signal line (VDD signal line)-RWL signal line.

Additionally, the signal line order (from interior of the memory cell 102 to the second edge 303 of the memory cell 102) of the conductive layer in the read port 502 in the memory cell 102 is as follows: RBL signal line-first power source signal line (VDD signal line)-RWL signal line. Like the embodiment shown in FIG. 4, positioning the VDD signal line between the RBL signal line and the RWL signal line enables the parasitic capacitance of the RBL signal line to be reduced because the RBL signal line is farther from the WWL signal line in the write port 500.

Like the embodiments shown in FIGS. 3 and 4, the ground bounce in the illustrated write port 500 is substantially balanced due to the local interconnect line 308*a* in the write port 500 that is operably connected to the first power source signal line (e.g., the supply voltage (VDD) signal line) being separate and distinct from the local interconnect line 308*b* in the read port 502 that is operably connected to the first power source signal line.

Figure 7:
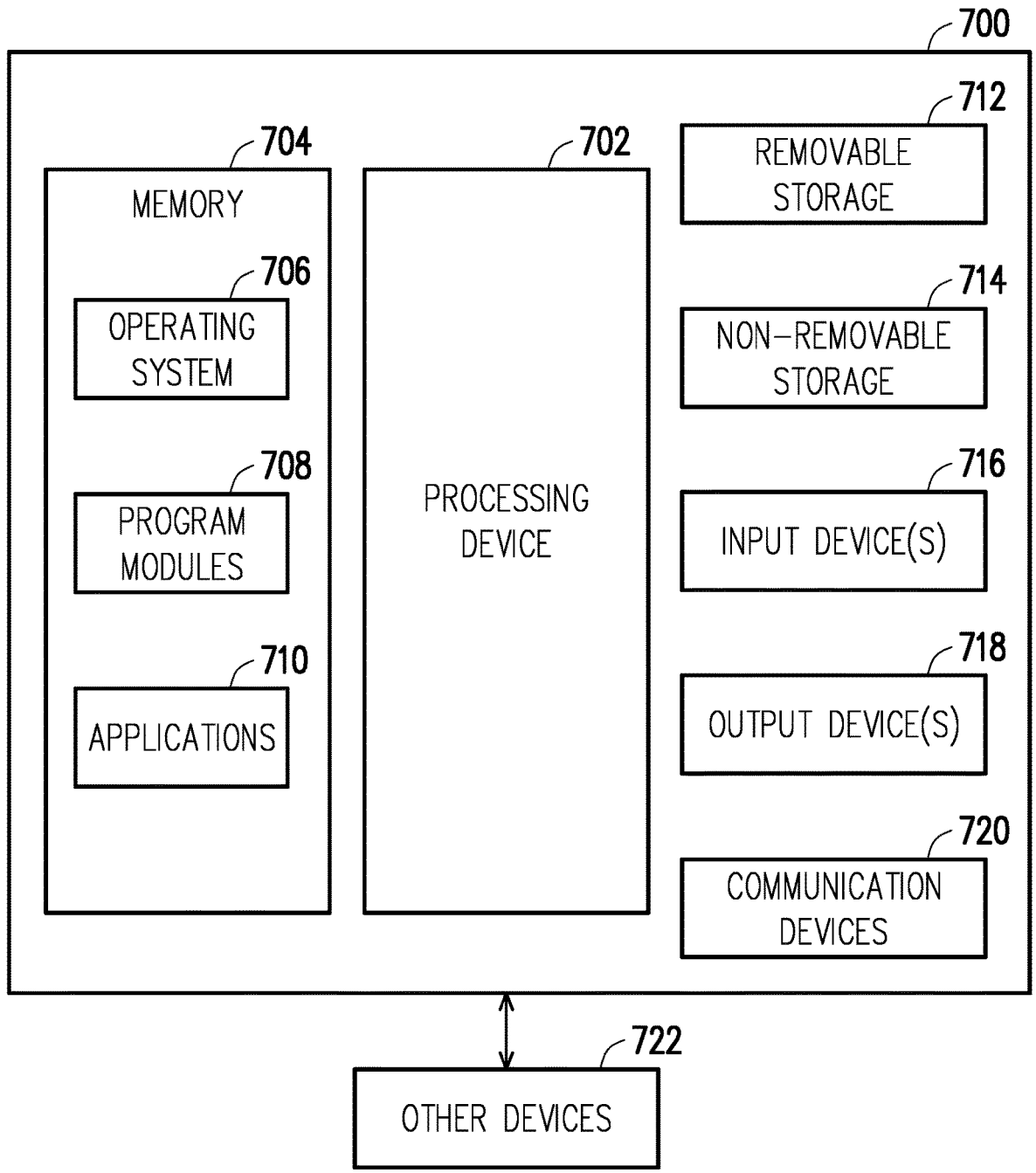
FIG. 7 illustrates a block diagram of a computing device with which aspects of the disclosure may be practiced in accordance with some embodiments.

FIG. 7 depicts a block diagram of a computing device in which aspects of the disclosure may be practiced in accordance with some embodiments. The computing device 700 can be any suitable computing device that includes one or more memories (e.g., memory devices). Example computing devices include, but are not limited to, an electronic gaming device, a smart television, a digital streaming computing device, and a portable computing device such as a smartphone, a laptop, and a wearable computing device.

In a basic configuration, the computing device 700 may include at least one processing device 702 and at least one memory 704. Any suitable processing device or devices can be used. Example processing devices include, but are not limited to, a microprocessor, an application specific integrated circuit, and/or a field programmable gate array. Depending on the configuration and type of the computing device 700, the memory 704 may comprise, but is not limited to, volatile storage (e.g., random access memory), non-volatile storage (e.g., read-only memory), flash memory, or any combination of such memories. The memory 704 may include a number of program modules and data files, such as an operating system 706 for controlling the operation of the computing device 700, one or more program modules 708 suitable for parsing received input, determining subject matter of received input, determining actions associated with the input and so on, and one or more applications 710.

The computing device 700 may have additional features or functionality. For example, the computing device 700 may also include additional data storage devices (removable and/or non-removable) such as, for example, magnetic disks, optical disks, or tape. Such additional storage is illustrated in FIG. 7 by a removable storage device 712 and a non-removable storage device 714.

The computing device 700 may also have one or more input device(s) 716 such as a keyboard, a trackpad, a mouse, a pen, a sound or voice input device, a touch, force and/or swipe input device, etc. The output device(s) 718 such as a display, speakers, a printer, etc. may also be included. The aforementioned input and output devices are examples and others may be used. The computing device 700 may include one or more communication devices 720 allowing communications with other computing devices 722. Examples of suitable communication devices 720 include, but are not limited to, cellular, IR, NFC, RF, and/or satellite transmitter, receiver, and/or transceiver circuitry, universal serial bus (USB), parallel, and/or serial ports.

The term computer-readable media as used herein may include computer storage media. Computer storage media may include volatile and nonvolatile, removable and non-removable media implemented in any method or technology for storage of information, such as computer readable instructions, data structures, or program modules.

The memory 704, the removable storage device 712, and the non-removable storage device 714 are all computer storage media examples (e.g., memory device). The computer storage media may include RAM (e.g., SRAM), ROM, electrically erasable read-only memory (EEPROM), flash memory or other memory technology, CD-ROM, digital versatile disks (DVD) or other optical storage, magnetic cassettes, magnetic tape, magnetic disk storage or other magnetic storage devices, or any other article of manufacture which can be used to store information and which can be accessed by the computing device 700. Any such computer storage media may be part of the computing device 700.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

In one aspect, a memory cell in a memory device includes a write port and a read port. The write port includes a storage unit comprising a first cross-coupled inverter connected to a second cross-coupled inverter, where the first and the second cross-coupled inverters are connected to a power source signal line. The write port further includes a first local interconnect line in an interconnect layer connected to the power source signal line. The read port includes a transistor connected to the storage unit in the write port and to the power source signal line. And a second local interconnect line in the interconnect layer connected to the power source signal line. The second local interconnect line in the read port is separate from the first local interconnect line in the write port.

In another aspect, a memory device includes a row select circuit, a column select circuit, and a memory array. The memory array includes multiple memory cells. Each memory cell includes a write port and a read port. The write port includes a storage unit comprising a first cross-coupled inverter connected to a second cross-coupled inverter, where the first and the second cross-coupled inverters are connected between a first power source signal line and a second power source signal line. The write port further includes a first local interconnect line in an interconnect layer connected to the first power source signal line and a second local interconnect line in the interconnect layer connected to the second power source signal line. The read port includes a transistor connected to the storage unit in the write port and to the second power source signal line, and a third local interconnect line in the interconnect layer connected to the second power source signal line. The third local interconnect line in the read port is separate from the second local interconnect line in the write port.

In yet another aspect, a computing device includes a processing device and a memory device connected to the processing device. The memory device includes a memory array of multiple memory cells. Each memory cell includes a write port and a read port. The write port includes a storage unit comprising a first cross-coupled inverter connected to a second cross-coupled inverter, where the first and the second cross-coupled inverters are connected between a first power source signal line and a second power source signal line. The write port further includes a first local interconnect line in an interconnect layer connected to the first power source signal line and a second local interconnect line in the interconnect layer connected to the second power source signal line. The read port includes a pass transistor and a transistor having a first terminal connected to the pass transistor, a gate connected to the storage unit in the write port, and a second terminal connected to the second power source signal line. The read port further includes a third local interconnect line in the interconnect layer connected to the second power source signal line. The third local interconnect line in the read port is separate from the second local interconnect line in the write port.

The description and illustration of one or more aspects provided in this application are not intended to limit or restrict the scope of the disclosure as claimed in any way. The aspects, examples, and details provided in this application are considered sufficient to convey possession and enable others to make and use the best mode of claimed disclosure. The claimed disclosure should not be construed as being limited to any aspect, example, or detail provided in this application. Regardless of whether shown and described in combination or separately, the various features (both structural and methodological) are intended to be selectively included or omitted to produce an embodiment with a particular set of features. Having been provided with the description and illustration of the present application, one skilled in the art may envision variations, modifications, and alternate aspects falling within the spirit of the broader aspects of the general inventive concept embodied in this application that do not depart from the broader scope of the claimed disclosure.

What is claimed is:

1. A memory cell in a memory device, comprising:
   a write port comprising:
      a storage unit comprising a first cross-coupled inverter connected to a second cross-coupled inverter, wherein the first and the second cross-coupled inverters are connected between a first power source signal line and a second power source signal line;
      a first pass transistor having a first terminal connected to a write bit line (WBL) signal line, a second terminal connected to the first cross-coupled inverter, and a first gate connected to a write word line (WWL) signal line;
      a second pass transistor having a third terminal connected to a write bit line bar (WBLB) signal line, a fourth terminal connected to the second cross-coupled inverter, and a second gate connected to the WWL signal line; and
      a first local interconnect line in an interconnect layer connected to the first power source signal line; and
   a read port comprising:
      a transistor connected to the storage unit in the write port and to the first power source signal line;
      a third pass transistor having a fifth terminal connected to a read bit line (RBL) signal line, a sixth terminal connected to the transistor, and a third gate connected to a read word line (RWL) signal line; and
      a second local interconnect line in the interconnect layer connected to the first power source signal line,
         wherein:

the second local interconnect line in the read port is separate from the first local interconnect line in the write port;

the WWL signal line, the WBL signal line, the WBLB signal line, the RWL signal line, the RBL signal line, the first power source signal line, and the second power source signal line are formed in a conductive layer; and a layout of the conductive layer from a first edge of the memory cell to an opposite second edge of the memory cell comprises: the WWL signal line-the first power source signal line-the WBL signal line-the second power source signal line-the WBLB signal line-the first power source signal line-the WWL signal line-the first power source signal line-the RBL signal line-the RWL signal line.

2. The memory cell of claim 1, wherein the write port further comprises a third local interconnect line in the interconnect layer connected to the second power source signal line.

3. The memory cell of claim 1, wherein:
the first pass transistor and the second pass transistor in the write port each comprise an n-type transistor; and
the third pass transistor and the transistor in the read port each comprise the n-type transistor.

4. The memory cell of claim 3, wherein:
the transistor in the read port comprises a pull down transistor;
the first power source signal line comprises a reference voltage signal line; and
the second power source signal line comprises a supply voltage signal line.

5. The memory cell of claim 1, wherein the first power source signal line is a VSS signal line and the second power source signal line is a VDD signal line.

6. The memory cell of claim 1, wherein ground bounce in the write port is substantially balanced based on the first local interconnect line in the write port being separate from the second local interconnect line in the read port.

7. The memory cell of claim 1, wherein the conductive layer comprises a metal layer.

8. The memory cell of claim 1, wherein:
the conductive layer is a first conductive layer; and
the memory cell further comprises:
a second conductive layer positioned above the first conductive layer; and
a contact formed between a signal line in the second conductive layer and a respective local interconnect line in the local interconnect layer.

9. A memory device, comprising:
a row select circuit;
a column select circuit; and
a memory array connected to the row select circuit and the column select circuit and comprising a plurality of memory cells, wherein each memory cell in the plurality of memory cells comprises:
a write port comprising:
a storage unit comprising a first cross-coupled inverter connected to a second cross-coupled inverter, wherein the first and the second cross-coupled inverters are connected between a first power source signal line and a second power source signal line;
a first pass transistor having a first terminal connected to a write bit line (WBL) signal line, a second terminal connected to the first cross-coupled inverter, and a first gate connected to a write word line (WWL) signal line;
a second pass transistor having a third terminal connected to a write bit line bar (WBLB) signal line, a fourth terminal connected to the second cross-coupled inverter, and a second gate connected to the WWL signal line;
a first local interconnect line in an interconnect layer connected to the first power source signal line; and
a second local interconnect line in the interconnect layer connected to the second power source signal line; and
a read port comprising:
a transistor connected to the storage unit in the write port and to the second power source signal line;
a third pass transistor having a fifth terminal connected to a read bit line (RBL) signal line, a sixth terminal connected to the transistor, and a third gate connected to a read word line (RWL) signal line; and
a third local interconnect line in the interconnect layer connected to the second power source signal line, wherein:
the third local interconnect line is separate from the second local interconnect line;
the WWL signal line, the WBL signal line, the WBLB signal line, the RWL signal line, the RBL signal line, the first power source signal line, and the second power source signal line are formed in a conductive layer; and
a layout of the conductive layer from a first edge of the memory cell to an opposite second edge of the memory cell comprises: the WWL signal line-the first power source signal line-the WBL signal line-the second power source signal line-the WBLB signal line-the first power source signal line-the WWL signal line-the first power source signal line-the RBL signal line-the RWL signal line.

10. The memory device of claim 9, wherein:
the first pass transistor and the second pass transistor in the write port each comprise an n-type transistor; and
the third pass transistor and the transistor in the read port each comprise the n-type transistor.

11. The memory device of claim 9, wherein:
the transistor in the read port comprises a pull down transistor;
the first power source signal line comprises a supply voltage signal line; and
the second power source signal line comprises a reference voltage signal line.

12. The memory device of claim 9, wherein a ground bounce in the first cross-coupled inverter in the storage unit and a ground bounce in the second cross-coupled inverter in the storage unit are substantially balanced based on the first local interconnect line in the write port being separate from the second local interconnect line in the read port.

13. The memory device of claim 9, wherein:
the conductive layer is a first conductive layer; and
the memory device further comprises:
a second conductive layer positioned above the first conductive layer; and
a contact formed between a signal line in the second conductive layer and the first local interconnect line.

14. The memory device of claim 9, further comprising one or more of:

a first contact formed between the first power source signal line and a respective local interconnect line in the interconnect layer;

a second contact formed between the WBL signal line and a respective local interconnect line in the interconnect layer;

a third contact formed between the WBLB signal line and a respective local interconnect line in the interconnect layer; or a fourth contact formed between the RBL signal line and a respective local interconnect line in the interconnect layer.

15. The memory device of claim 9, wherein the first power source signal line is a VSS signal line and the second power source signal line is a VDD signal line.

16. The memory device of claim 9, wherein the memory device is a static random access memory device.

17. A computing device, comprising:

a processing device; and a memory device operably connected to the processing device, the memory device comprising:

a memory array comprising a plurality of memory cells, wherein each memory cell in the plurality of memory cells comprises:

a write port comprising:

a storage unit comprising a first cross-coupled inverter connected to a second cross-coupled inverter, wherein the first and the second cross-coupled inverters are connected between a first power source signal line and a second power source signal line;

a first pass transistor having a first terminal connected to a write bit line (WBL) signal line, a second terminal connected to the first cross-coupled inverter, and a first gate connected to a write word line (WWL) signal line;

a second pass transistor having a third terminal connected to a write bit line bar (WBLB) signal line, a fourth terminal connected to the second cross-coupled inverter, and a second gate connected to the WWL signal line; and a first local interconnect line in the interconnect layer connected to the second power source signal line; and a read port comprising:

a transistor having a gate connected to the storage unit in the write port and a first terminal connected to the second power source signal line;

a third pass transistor having a fifth terminal connected to a read bit line (RBL) signal line, a sixth terminal connected to a second terminal of the transistor, and a third gate connected to a read word line (RWL) signal line; and a second local interconnect line in the interconnect layer connected to the second power source signal line, wherein:

the second local interconnect line is separate from the first local interconnect line;

the WWL signal line, the WBL signal line, the WBLB signal line, the RWL signal line, the RBL signal line, the first power source signal line, and the second power source signal line are formed in a conductive layer; and a layout of the conductive layer from a first edge of each memory cell to an opposite second edge of the memory cell comprises: the WWL signal line-the second power source signal line-the WBL signal line-the first power source signal line-the WBLB signal line-the second power source signal line-the WWL signal line-the second power source signal line-the RBL signal line-the RWL signal line.

18. The computing device of claim 17, wherein:

the transistor in the read port comprises a pull down transistor;

the first power source signal line comprises a supply voltage signal line; and the second power source signal line comprises a reference voltage signal line.

19. The computing device of claim 17, wherein ground bounce in the write port is substantially balanced by the first local interconnect line in the write port being separate from the second local interconnect line in the read port.

20. The computing device of claim 17, wherein the write port further comprises a third local interconnect line in the interconnect layer connected to the first power source signal line.

* * * * *